(12) United States Patent
Milosavljevic et al.

(10) Patent No.: US 7,723,761 B1
(45) Date of Patent: May 25, 2010

(54) TIERED GATE STRUCTURE DEVICES

(75) Inventors: Ivan Milosavljevic, Westlake Village, CA (US); Adele Schmitz, Newbury Park, CA (US); Michael Delaney, Thousand Oaks, CA (US); Michael Antcliffe, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 12/212,627

(22) Filed: Sep. 17, 2008

Related U.S. Application Data

(62) Division of application No. 11/150,439, filed on Jun. 11, 2005, now Pat. No. 7,439,166.

(51) Int. Cl.
*H01L 29/80* (2006.01)

(52) U.S. Cl. .................. 257/280; 438/182; 438/574

(58) Field of Classification Search .................. 257/280; 438/182, 574
See application file for complete search history.

(56) References Cited

U.S. PATENT DOCUMENTS

| | | | |
|---|---|---|---|
| 5,500,381 A | 3/1996 | Yoshida et al. | |
| 5,693,548 A * | 12/1997 | Lee et al. | 438/172 |
| 5,770,525 A * | 6/1998 | Kamiyama | 438/745 |
| 5,981,319 A | 11/1999 | Lothian et al. | |
| 6,051,454 A | 4/2000 | Anda et al. | |
| 6,294,446 B1 | 9/2001 | Ishikawa | |
| 6,387,783 B1 * | 5/2002 | Furukawa et al. | 438/574 |
| 6,417,084 B1 * | 7/2002 | Singh et al. | 438/585 |
| 6,737,202 B2 | 5/2004 | Gehoski et al. | |

FOREIGN PATENT DOCUMENTS

JP          04062936 A  *  2/1992

OTHER PUBLICATIONS

R. Grundbacher, Iadesida, Y.-C.Kao, AA Ketterson, Single step lithography for double-recessed gate pseudomorphic high electron mobility transistors, J. Vac. Sci. Technol. B 15(1), pp. 49-52, American Vacuum Society, Jan./Feb. 1997.

* cited by examiner

*Primary Examiner*—Bradley K Smith
*Assistant Examiner*—Marvin Payen
(74) *Attorney, Agent, or Firm*—Christopher R. Balzan

(57) ABSTRACT

In one embodiment, a tiered gate structure is provided having a substrate including a source, a drain and a gate thereon. The gate includes an elongated gate foot having a first deposition gate material extending from the substrate, the elongated gate foot having a top portion distal from the substrate. The gate head has a second deposition gate material and includes an elongated portion extending downward from the gate head to connect to the top portion of the elongated gate foot.

9 Claims, 4 Drawing Sheets

TIERED GATE STRUCTURE DEVICES

CROSS REFERENCE TO RELATED APPLICATION

This application is a divisional of U.S. patent application Ser. No. 11/150,439, by Milosavljevic, et al., entitled METHOD FOR PRODUCING TIERED GATE STRUCTURE DEVICES, filed Jun. 11, 2005 now U.S. Pat. No. 7,439,166, herein incorporated by reference in its entirety.

BACKGROUND

FIG. 1 shows a cross section side view of a prior art T-gate structure. A T-gate structure 100 often has a T-shaped gate 125, referred to as simply a T-gate. In general a T-gate is any device which has a narrow gate foot 65 and a relatively wider gate head 165. Sometimes the same or similar structures are referred to as Y-gates and/or mushroom gates due to their final shape. In yet another instance, a gamma-gate or asymetric gate can be produced. A gamma-gate has a cross section similar to the Greek letter gamma. Accordingly, the terms T-gate, Y-gate, mushroom gate, gamma-gate, and asymmetric gate refer to a tiered gate structure with a narrow gate foot 65 and a relatively wider gate head 165. In this disclosure the term T-gate, the most general and widely used term to refer to such tiered gate structure devices, is intended to encompass all of these structural variations.

Most T-gate processes utilize electron beam lithography to produce short gate length devices. While gate lengths less than 100 nanometers are commonly achievable, the short height of the gate foot 65 (the distance between the surface of the substrate 110 and the bottom of the gate head 165) required to produce such short gate lengths, creates unwanted parasitics between the gate head 165 and the source 120, and between the gate head 165 and the drain 130, indicated as $C_{gs}$ and $C_{gd}$, respectively. This occurs because of the aspect ratio limitation between feature size and resist thickness in electron beam lithography. Electrons undergo forward and back scattering during exposure which limit the minimum feature size to around half of the resist thickness at a 50 kV acceleration voltage. This short separation also hinders nitride coverage of the gate structure 125 during passivation.

FIG. 1 also illustrates the voids 167 and 168 which form during metal evaporation. Voids 167 and 168 form on either side of the gate foot 65 extending upward between the gate foot 65 and gate head 165. This can present a reliability problem. The upward extending voids 167 and 168 form during metal evaporation when some metal coats the side of the imaging layer mask causing the metal to self-mask. As the evaporation continues, the voids 167 and 168 form between the gate foot 65 and gate head 165 until gate foot 65 and gate head 165 finally join, which may occur well into the gate head 165. In some cases, the gate head 165 can fail to join with the gate foot 65 during fabrication, thereby forming non-functioning devices. In its connection with gate head 165, the gate foot 65 extends into and attaches to the gate head 165 recessed within voids 167 and 168. This causes a weakness in the gate structure 125 where cracks can propagate and cause breakage of the gate structure 125.

Furthermore, a downward extending recess 169 is present in the top of the gate head 165 because the gate foot 65 is formed in the same metallization step as the gate head 165. Thus, as the deposited metallization layer extends to the substrate 110 to form the gate foot 65, it leaves the recess 169 in the gate head 165 located above the gate foot 65. Any cracks forming from the upwardly extending voids 167 and 168 need only extend to the downwardly extending recess 169 to cause breakage of the gate head 165 from the gate foot 65.

Another disadvantage of the T-gate structure of FIG. 1 is that the gate length (width of the gate foot 65 adjacent the substrate 110) can not be measured during a conventional fabrication process. For example, with the process of U.S. Pat. No. 6,417,084, by Singh, et al., entitled T-GATE FORMATION USING A MODIFIED CONVENTIONAL POLY PROCESS, issued Jul. 9, 2002, herein incorporated by reference, the undercut regions are located beneath a wider contact portion which obscures measurement of the gate length. In U.S. Pat. No. 6,387,783, by Furukawa, et al., entitled METHODS OF T-GATE FABRICATON USING A HYBRID RESIST, issued May 14, 2002, herein incorporated by reference, the wider top 117 as well as layer 111 prevents measurement of the gate length during fabrication. In these processes, the gate length is measured by destroying the T-gate device.

Also, traditional methods are performed with two exposure passes. In the first exposure, the top resist is exposed to define the gate head 165. The lower resist which will define the gate foot 65, is partially exposed in the first exposure, but not enough to develop it. The top resist is developed and a second exposure is used to define the gate foot 65. This creates a history on the lower resist layer. This history can cause non-uniformities in the gate foot 65 to occur across the wafer.

What is needed is a non-destructive way to determine gate length. Furthermore, what is needed is a process that allows measurement of the gate length in situ during processing. Also, what is needed is a simple process that improves process uniformity and yields. In addition, what is needed is a process that allows reducing of the gate to source capacitance and the gate to drain capacitance.

SUMMARY

In one embodiment, a tiered gate structure is provided having a substrate including a source, a drain and a gate thereon. The gate includes an elongated gate foot having a first deposition gate material extending from the substrate, the elongated gate foot having a top portion distal from the substrate. The gate head has a second deposition gate material and includes an elongated portion extending downward from the gate head to connect to the top portion of the elongated gate foot.

In one implementation, a method for fabricating a tiered structure is provided, which includes forming a source and a drain on a substrate with a gate formed therebetween. Formation of the gate includes depositing a gate foot using a gate foot mask having an opening through it to define the gate foot over the substrate.

After forming the gate foot, the gate foot mask is stripped. A gate head mask is formed over the gate foot with the gate head mask exposing a top portion of the gate foot. A gate head is formed on the top portion of the gate foot using the gate head mask. A lift-off process is performed, removing at least a portion of the gate head mask.

In some implementations the gate foot mask is a bilayer resist mask comprising dissimilar resist types. The gate foot mask may be formed with an opening through an upper resist layer and through a lower resist layer adjacent the substrate, the upper resist layer overhanging the lower resist layer in the opening. Gate foot material is deposited to form the gate foot within the opening. A lift-off process of the gate foot mask with the gate foot material thereon may be performed without removing the gate foot.

Formation of the gate head may include forming the gate head mask with an opening through an upper mask layer and through an intermediate mask layer and part way into a lower mask layer sufficient to expose the top portion of the gate foot. The gate head may be formed on the top portion of the gate foot by depositing gate head material thereon. A lift-off process may be performed to remove at least a portion of the gate head mask, after deposition of the gate head material.

In certain implementations, the gate head may be formed centered over the gate foot. In other implementations the gate head may be formed off-set over the gate foot. In certain implementations the gate head may be formed with an elongated portion extending downward and attaching to the top portion of the gate foot.

In another implementation, a method for fabricating tiered structures is provided. This may include forming a source and a drain adjacent to a substrate, and forming a gate between the source and the drain. The gate foot may be formed by forming a gate foot mask having a gate foot opening through an upper resist layer and through a lower resist layer, and depositing gate foot material within the opening. Thereafter, the gate foot mask is stripped and the gate foot material on the mask is lifted off. The method further includes forming a gate head mask having an opening sufficient to expose a top portion of the gate foot and depositing gate head material to form the gate head on the top portion of the gate foot. A lift-off is performed of the gate head material on the gate head mask.

In certain implementations, forming the gate foot mask includes depositing a low sensitivity resist over a high sensitivity resist. In some implementations, forming the gate foot mask includes using an e-beam to expose the upper and lower resist layers of the gate foot mask such that the upper resist layer overhangs the lower resist layers after developing. The exposure of the upper and lower resist layers of the gate foot mask may be performed prior to developing the upper and lower resist layers of the gate foot mask.

In certain implementations, forming the gate head mask includes forming an opening through an upper resist layer and through an intermediate resist layer and part way into a lower resist layer sufficient to expose the top portion of the gate foot. The lift-off of the gate head material on the gate head mask may include stripping the intermediate resist layer of the gate head mask.

In some implementations, forming the gate head mask includes depositing a lower resist layer on the gate foot, an intermediate resist layer over the lower resist layer, and an upper resist layer over the intermediate resist layer. The upper, intermediate, and lower resist layers are exposed with electron beam radiation. The developing of the upper resist layer and intermediate resist layer are performed with different developer types. Also, the developing the intermediate resist layer and the lower resist layer are performed with different developer types.

In some implementations, defining the gate head mask includes providing the opening substantially centered above the gate foot. In alternate implementations, defining the gate head mask includes providing the opening off-set above the gate foot. In some implementations, defining the gate head mask includes providing an elongated tapered opening extending partially through a lower resist layer of the gate head mask to the top portion of the gate foot.

BRIEF DESCRIPTION OF THE DRAWINGS

The features and advantages of the present invention will be better understood with regard to the following description, appended claims, and accompanying drawings where:

DESCRIPTION

In the description of the invention that follows, like numerals or reference designators will be used to refer to like parts throughout. Furthermore, the FIGS. are for illustrative purposes and are not necessarily to scale.

Figure 2A:
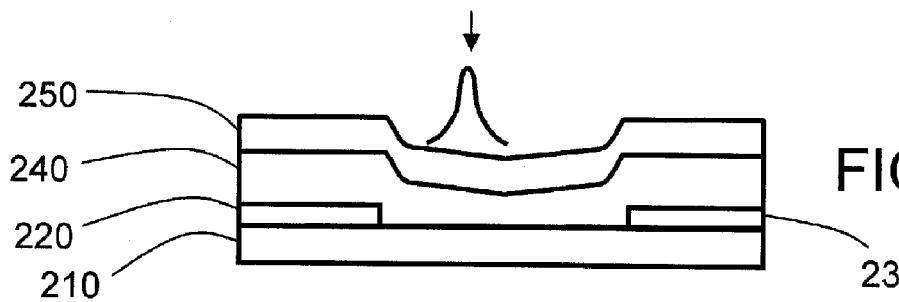
FIGS. 2A-2C are simplified illustrations in cross sectional side view illustrating fabrication of a gate foot of a T-gate device in accordance with an implementation of the present invention.
Figure 2B:
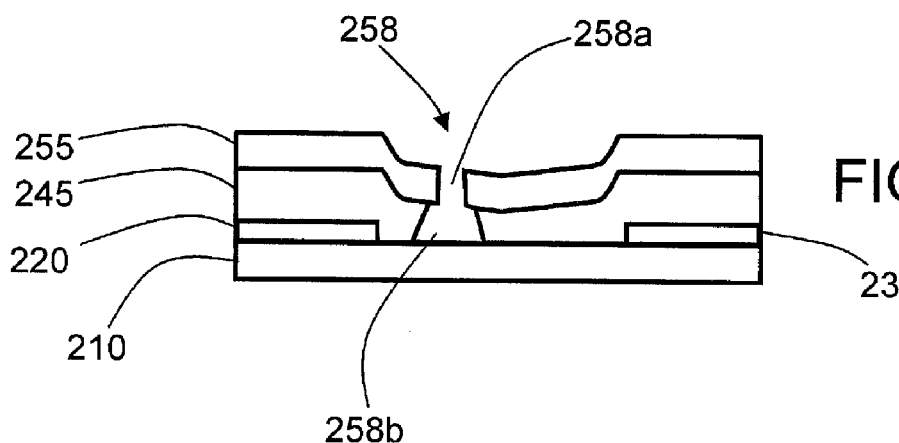
Figure 2C:
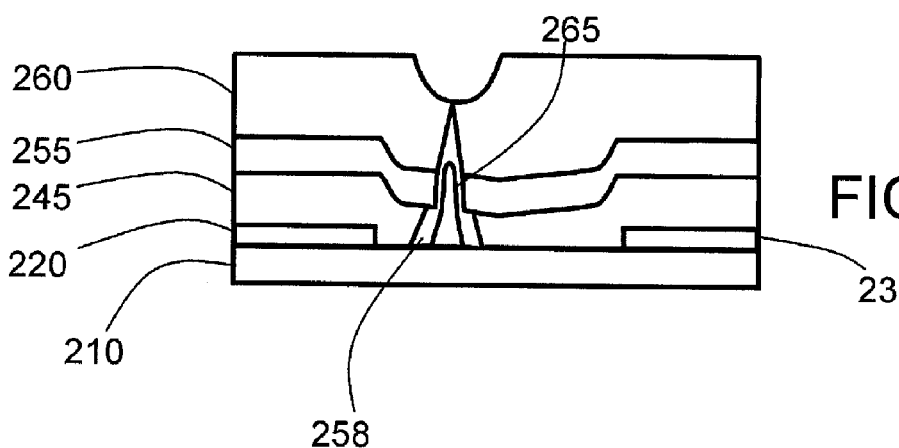

FIGS. 2A-2C are simplified illustrations in cross sectional side view illustrating fabrication of a gate foot 265 of a T-gate device (not shown) in accordance with an implementation of the present invention. FIG. 2A shows a substrate 210 with two dissimilar resist layers 240 and 250 overlying the source 220, the drain 230, and the substrate 210. The dissimilar resist layers 240 and 250 are selected so that they are based on different solvents and will not intermix. For example, the lower resist layer 240 may be copolymer resist such as MMA/MAA, and the upper resist layer 250 may be PMMA 950K. The lower resist layer 240 is a high sensitivity resist while the upper resist layer 250 is a low sensitivity resist. It is possible in some implementations to use a single resist layer rather than two.

A first exposure (indicated as an arrow above a gaussian curve at the top of FIG. 2A) with a high acceleration e-beam having a single peak gaussian like profile defines a narrow gate foot opening 258 (shown in FIG. 2B) in the mask defined by upper and lower resist layers 255 and 245 (shown in FIG. 2B). The exposure acceleration voltage will depend on the desired thicknesses and types of resist in the upper and lower resist layers 250 and 240. The exposure acceleration voltage for example may be about 50 kV, is indicated in FIG. 2A.

After the first exposure, the resist layers 250 and 240 are developed using two different developers. The first developer does most of the developing of the upper resist layer 250, while the second developer is selective to develop only the lower resist layer 240. Thus, an under cut of the upper resist layer 255 by the lower resist layer 245 is possible to leave a well defined wider opening 258b in the lower resist layer 245 adjacent the substrate 210, with the upper resist layer 255 overhanging the lower resist layer 245, as shown in FIG. 2C. The narrower opening 258a in the upper resist layer 255 defines the width of the gate foot 265, i.e. the gate length, on the substrate 210, shown in FIG. 2C.

Shown in FIG. 2C, a gate foot 265 is formed in the opening 258. An optional gate etch may be performed with a wet etch, to etch slightly into the substrate 210 prior to formation of a gate foot 265. The wider opening 258b (shown in FIG. 2B) in the lower resist layer 245 allows a uniform gate etch across the surface of the substrate 210 where the gate foot 265 attaches to the substrate 210. Deposition of the gate foot material layer 260 results in the formation of the gate foot 265 on the substrate 210 through the opening 258 in the mask formed by the resist layers 255 and 245. The gate material is a conductor material, which typically is a metal such as gold or the like.

A lift-off process (known in the art) removes the gate foot material layer 260 with the removal of the resist layers 245 and 255. After the lift-off process, the width (gate length) of the gate foot 265 and the height of the gate foot 265 may be measured, prior to formation of the gate head 365 (shown in FIG. 3C). This allows the gate length to be measured early in the manufacturing process, even in situ if desired, without requiring destruction of the T-gate device to perform the measurement. The gate etch length and the source-to-gate spacings can also be measured at this time.

Also, electrical measurements of the gate foot 265 may be conducted prior to completion of the T-gate device. For example, DC measurements may be made to determine if the gate foot 265 is functioning properly. Thus, it is possible to make measurements of the transconductance, resistance, etc., prior to completing fabrication of the T-gate device.

Figure 3A:
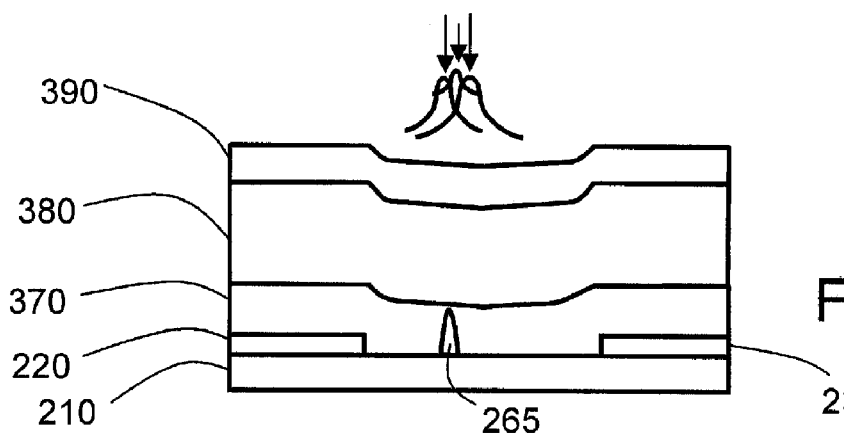
FIGS. 3A-3C are simplified illustrations in cross sectional side view illustrating fabrication of a gate head of a T-gate device in accordance with an implementation of the present invention.
Figure 3B:
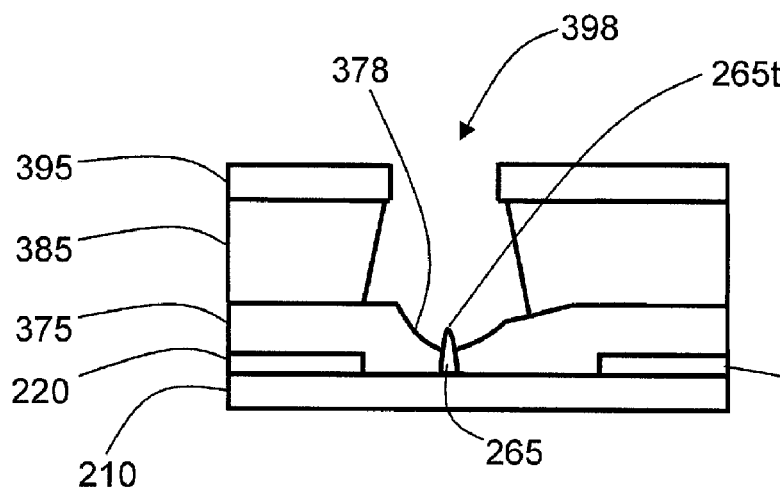
Figure 3C:
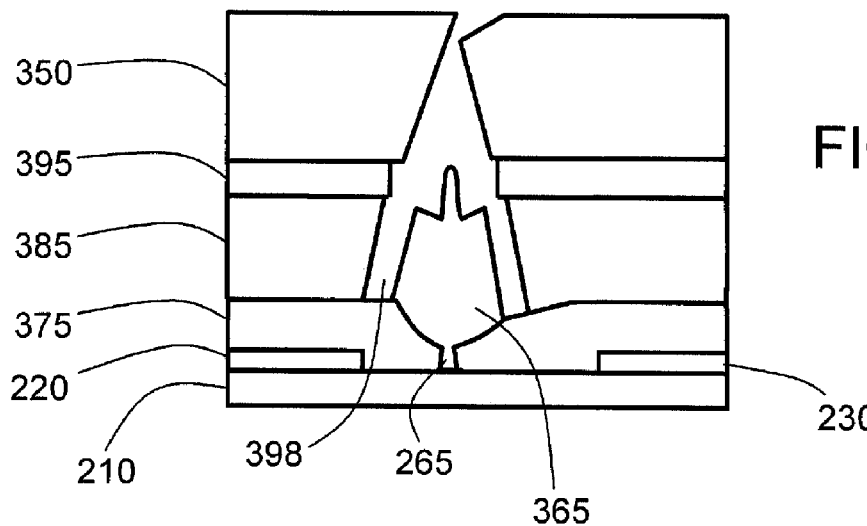

FIGS. 3A-3C are simplified illustrations in cross sectional side view illustrating fabrication of a gate head 365 of a T-gate device (not shown) in accordance with an implementation of the present invention. After formation of the gate foot 265, the gate head 365 is formed. Three layers of resist 370, 380, and 390 are deposited over the gate foot 265. Dissimilar resists can be used so that adjacent resist layers do not intermix. The lower resist layer 370 is deposited thick enough to cover the gate foot 265 and may be a medium sensitivity resist, such as PMMA 495k. The middle resist layer 380 acts as a spacer between upper and lower resist layers 390 and 370 and can be relatively thick as compared to resist layers 390 and 370. The middle resist layer 380 may be a copolymer, such as MMA (17.5)/MAA. The upper resist layer 390, can be an imaging layer and may be a medium sensitivity resist, such as PMMA 495k.

A second exposure, (indicated as three arrows above three gaussian curves at the top of FIG. 3A) exposes resist layers 390, 380, and 370 shown in FIG. 3A. After exposure, the resist layers 390, 380, and 370 are developed leaving an opening 398 in the mask formed by the resist layers 395, 385, and 375 as shown in FIG. 3B. Although it is possible to use a single peak gaussian like profile to define the opening 398, in the implementation of FIG. 3A the e-beam exposure may use overlapping sidelobe doses with a light centerline dose (as indicated by the smaller guassian curve at the top of FIG. 3A). The resulting exposure forms a gaussian distribution in the resist layers 370, 380, and 390. This is depicted in FIG. 3A as three overlapping gaussian like profiles. For this second exposure, it is possible to use a low voltage, such as 20 kV. As discussed further below with reference to FIG. 3C, the exposure energy and the develop time are selected so that the top surface 265t of the gate foot 265 is not covered by resist layers 390, 380 or 370 after developing, but does leave some of the lower resist layer 370 next to the gate foot 265. Thus, the lower resist layer 370 is not developed all the way through to the substrate 210, or expose the source 220 or drain 230. Instead, some of the lower resist layer 370 will remain adjacent the sides of the gate foot 265 and over the source 220 and drain 230 after developing.

Turning to FIG. 3B, after second exposure, a developer is selected which removes the exposed portion of the upper resist layer 395 and part of the middle resist layer 385. For example, Methyl-isobutyl-ketone or MIBK may be used to remove the exposed portion of an upper resist layer 395 formed of PMMA and part of the exposed portion of a middle resist layer 385 formed of MMA(17.5)/MAA copolymer. Next the developed portion of the middle resist layer 385 of MMA(17.5)/MAA copolymer is removed with a PMGEA: ETOH (1:5) solution. This solution does not affect the PMMA of the lower resist layer 375 or the upper resist layer 395. A dimple 378 in the lower resist layer 375 is formed using MIBK developer to uncover the top of the gate foot 265. The second exposure energy, the type and strength of the developer, and the develop times, are selected to ensure that only a top portion 265t of the gate foot 265 is uncovered without uncovering the substrate layer 210, the source 220, or the drain 230.

It should be noted that although the above implementation is discussed with reference to exposure followed by the develop stages, it is possible in other implementations to perform the exposure and develop of resist layers 390, 380, and 370 in one or more alternating exposure and develop stages. In some implementations, it is possible to inspect resist layer 375 to determine if the top of the gate foot 265 is uncovered, before deposition of the gate head 365. If it is not, an additional exposure and/or develop may be performed. The gate foot 265 is distinguishable from the resist by inspection, such as with an electron microscope, or other inspection tool. As such, it is possible to verify in situ whether the processes parameters, such as for example the exposure dosages and develop times are providing the best possible process uniformity. This provides process feedback that allows refinement of the parameters without having to complete fabrication of the device. It also allows for remedial action prior to complete fabrication of the device.

In one possible implementation, after developing the lower resist layer 375 to uncover a top portion of the gate foot 265, an etch may be performed to remove any surface passivation, or oxidation, from the top portion of the gate foot 265 prior to gate head deposition. This ensures good electrical properties at the interface of the gate foot 265 and the gate head 365.

The resist profile formed in the resist layers 395, 385, and 375 define the gate head 365. Since a continuous profile faces the deposition source, during deposition, no voids will form between the gate foot 265 and the gate head 365. The gate head material may be deposited by various deposition techniques known in the art. The opening 398 in the mask formed by resist layers 395, 385, and 375 defines the gate head 365 during the gate head deposition process. After deposition, the gate head material layer 350 is removed with a lift-off process by stripping the resist layers 375, 385, and 395 with a solvent, such as acetone. Other resists, developers, and stripper solutions are possible, but should be compatible with the particular substrate material being utilized, i.e. InP, GaAs, GaN, Si, SiC, etc.

Figure 1:
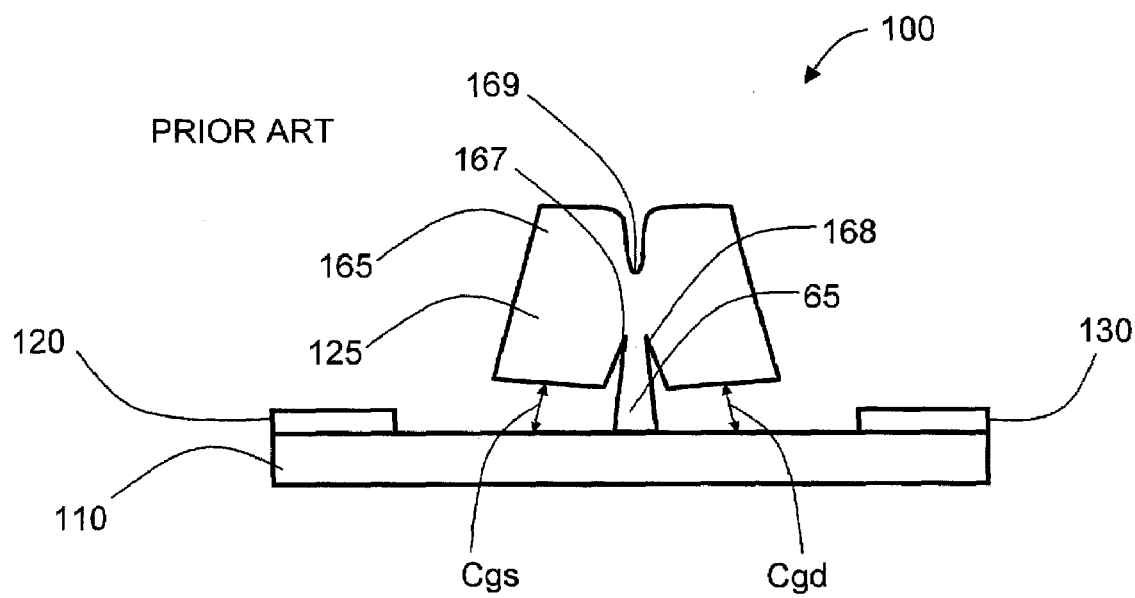
FIG. 1 shows a cross section side view of a typical T-gate device.
Figure 4:
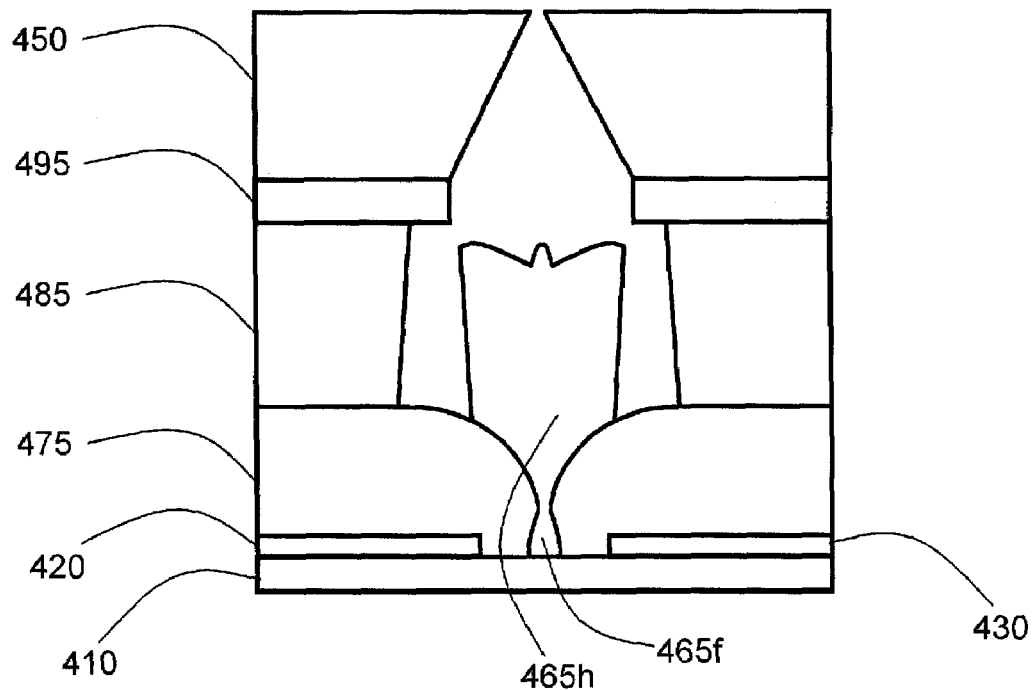
FIG. 4 is a cross section side view of a Y-gate structure.

Turning to FIG. 4, certain implementations of the present invention allow for reduced parasitic capacitances as compared to a conventional T-gate formed with conventional processes. The embodiment of FIG. 4 is sometimes also referred to as a Y-gate structure. The lower resist layer 475 can be deposited over the gate foot 465f with an greater thickness than when forming the entire gate structure with one deposition, such as metallization. This increases the distance between the gate head 465h and the source 420 and between the gate head 465h and the drain 430, thereby decreasing the gate-to-source and the gate-to-drain parasitic capacitances. Thus, in addition to reducing voids, reduced parasitic capacitances are achievable.

The e-beam exposure profile (not shown) is selected to provide a more narrow profile through the lower resist layer 475 to the gate foot 465f. As in the above implementation, the upper resist layer 495 and gate material layer 450 are removed in a lift-off process when the middle resist layer 485 is stripped.

Asymmetric Gate Etch and Off Set Gate Head (FIGS. 5A-6B)

Figure 5A:
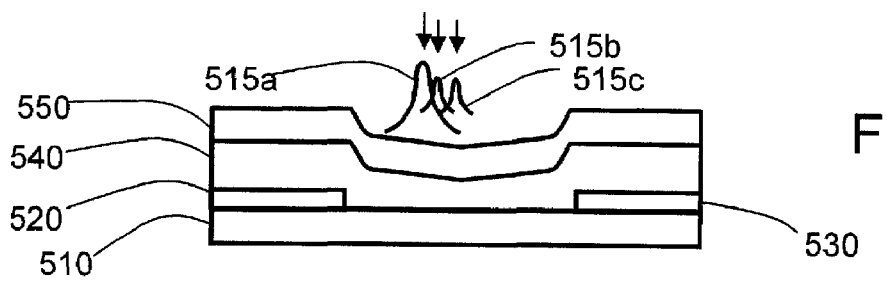
FIGS. 5A and 5B are simplified illustrations in cross sectional side view illustrating fabrication of a gate foot of a gamma T-gate device in accordance with an implementation of the present invention.
Figure 5B:
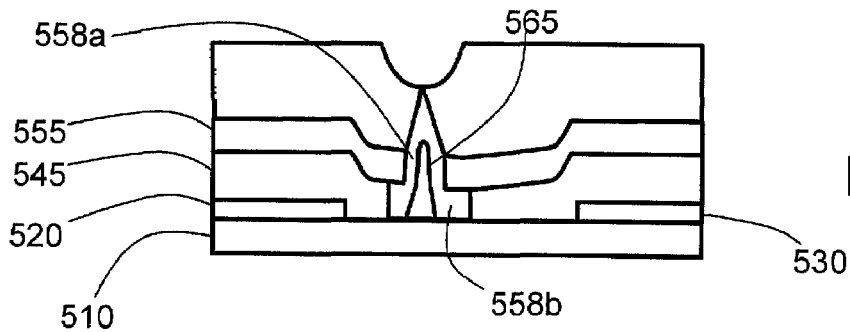
Figure 6A:
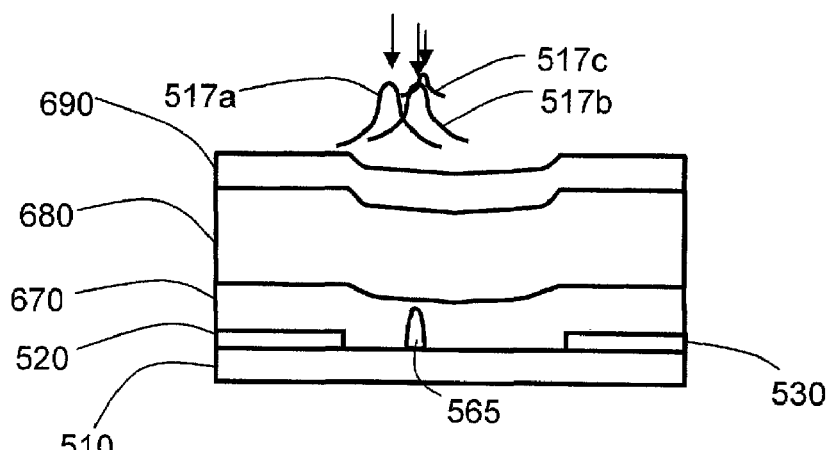
FIGS. 6A and 6B are simplified illustrations in cross sectional side view illustrating fabrication of a gate head of a gamma T-gate device (not shown) in accordance with an implementation of the present invention.

FIGS. 5a and 5b are Simplified Illustrations in Cross sectional side view illustrating fabrication of a gate foot 565 of for an asymmetric gate etch device (not shown) in accordance with an implementation of the present invention. An asymmetric gate or gamma gate is illustrated in U.S. Pat. No. 5,693,548, by Lee, et al., entitled METHOD FOR MAKING T-GATE OF FIELD EFFECT TRANSISTOR, issued Dec. 2, 1997, herein incorporated by reference. In implementation of FIGS. 5A-6B, the gate etch of the substrate 510 etch is asymmetric, with the gate foot 565 being deposited on the substrate 510 closer to the source 520 side of the gate etch. This can improve the breakdown voltage by spreading the space charge layer on the drain side of the gate. Along with this, the short distance between the gate foot 565 and the source 510 reduces the source resistance. This structure can be created by adding a light exposure on the drain side of the gate foot exposure as indicated in FIG. 6A (as indicated by an arrow above the smaller guassian curve 517c at the top of FIG. 6A). The exposure dose should be light enough to remove the underlying copolymer layer but not the overlying PMMA 950K layer when developed.

Referring to FIGS. 5A and 5B, as above, two dissimilar resist layers 550 and 540 are exposed with an e-beam 515a-c. In this implementation, in forming the gate foot 565, the e-beam has a distribution with a larger dose 515a for developing the upper resist layer 550, and lighter doses 515b and 515c for developing the lower resist layer 540 delivered at the side of the larger dose 515a. For example, a total dose of 50 kV with the lighter doses 515b and 515c having peaks aligned to the right side of the peak of the larger dose 515a (indicated as three arrows above three gaussian curves at the top of FIG. 5A).

The larger dose 515a defines the opening 558a through the upper resist layer 555, while the lighter doses 515b and 515c define an off set opening 558b in the lower resist layer 545. The lighter doses 515b and 515c develop the copolymer of the lower resist layer 545 and leave behind the PMMA of the upper resist layer 555. As shown in FIG. 5B, the exposure pattern 515a-c can be used to create the asymmetric etch and provide a gate foot 565 that is off set away from the drain 530.

Figure 6B:
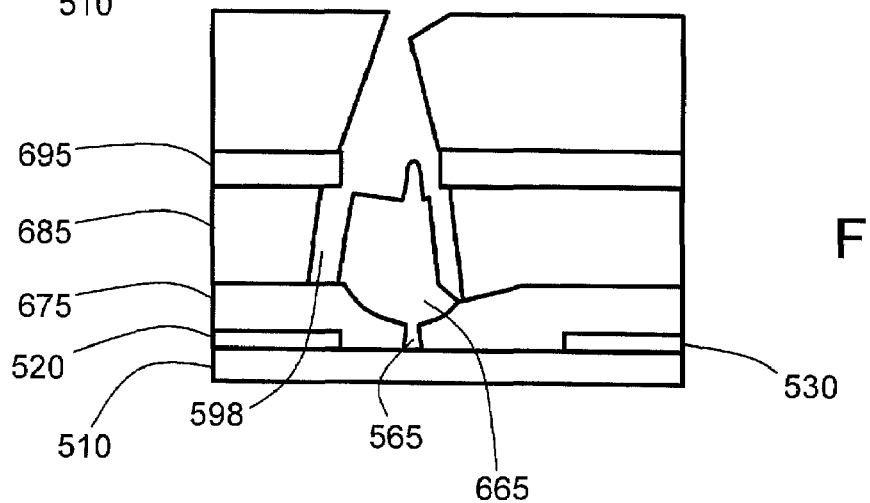

Turning to FIGS. 6A and 6B, the gate head 665 is formed on the gate foot 565, off set from the gate foot 565. Since the gate foot 565 and the gate head 665 are formed with separate exposures and depositions, the relative placement of the gate head 665 with respect to the gate foot 565 may be controlled. As above, three resist layers 670, 680, and 690 are deposited over the gate foot 565. The three resist layers are exposed with several e-beam doses (indicated as three arrows above three gaussian curves at the top of FIG. 6A). This defines an opening 598 in the resist layers 695, 685, and 675. The opening 598 is formed similar to the opening 398 discussed above with reference to FIG. 3B. Although it is possible to use a single, or a double peak gaussian like profile, in the implementation of FIG. 6A the e-beam exposure takes place using several doses, with one 517b having its peak centered over the gate foot 565 and another 517a having its peak off set to a side of the gate foot 565. Yet another, smaller dose 517c may be centered over the gate foot 565, as illustrated in FIG. 6A. For this exposure, it is possible to use a low voltage, such as 20 Kv.

The resulting opening in the resist layers 695, 685, and 675 uncovers the gate foot 565 and is off set to the side of the gate foot 565. Thus, the gate head 665 is not centered above the gate foot 565 and centered between the source 520 and drain 530. Instead, the gate head 665 is located closer to the source 520 than to the drain 530. In this implementation, therefore, because the gate foot 565 and gate head 665 are created independently, the gate head 665 can be off set toward the source, reducing the gate-to-drain capacitance $C_{gd}$. Since the gate-to-drain capacitance increases by the Miller effect (multiplied by the device's voltage gain), reducing the gate-to-drain capacitance can improve frequency response.

With certain of the above described implementations, it is possible to produce ultra-short, low-resistance T-gate structures for HEMT, HFET, PHEMT, and MESFET devices to eliminate the problem of void formation during metal deposition. Certain implementations may be used to produce reliable T-gate structures for sub-millimeter devices.

Some implementations provide the ability to increase distance between the gate head and substrate to reduce the gate to source capacitance and the gate to drain capacitance.

Furthermore, some implementations, allow in situ evaluation of gate length prior to complete fabrication, allowing verification of process parameters during processing, in situ, leading to greater uniformity and yields. Further, improved uniformity across a wafer is achievable.

The above implementations are not limited to the example resists and developers discussed above, or to specific exposure levels. Moreover, although described above with reference to T-gate, gamma gate, and Y-gate structures, the present invention is not limited to these types. Other types of resists and developers may be used. Further, the above implementations are not limited to soft masks and may include hard masks.

Having described this invention in connection with a number of implementations and embodiments, modification will now certainly suggest itself to those skilled in the art. The invention is not intended to be limited to the disclosed implementations and embodiments, except as required by the appended claims.

What is claimed is:

1. A tiered gate structure comprising a substrate comprising a source, a drain and a gate thereon, the gate comprising:
    a) an elongated gate foot comprising a first conductive deposition gate material extending from the substrate, the elongated gate foot comprising a top portion distal from the substrate; and
    b) a gate head comprising a conductive second deposition gate material and comprising an elongated portion extending downward toward the top portion of the elongated gate foot at an end of the elongated portion distal from the gate head, the elongated portion of the gate head having a width that decreases as the elongated portion extends away from the gate head toward the distal end, connecting to the distal portion of the elongated gate foot, the elongated portion of the gate head having a width that decreases as the gate head extends towards the gate foot.

2. The structure of claim 1, wherein the gate head is substantially centered above the elongated gate foot.

3. The structure of claim 1, wherein the gate head is off-set above the elongated gate foot.

4. The structure of claim 1, wherein the conductive first deposition gate material and the conductive second deposition gate material comprise a metal.

5. A tiered gate structure comprising a substrate comprising a source, a drain and a gate thereon, the gate comprising:

a) an elongated gate foot comprising a conductive first deposition gate material extending from the substrate, the elongated gate foot comprising a top portion distal from the substrate; and
b) a gate head comprising a conductive second deposition gate material comprising an elongated tapered portion extending downward and narrowing as the elongated tapered portion extends away from the gate head to connect to the top portion of the elongated gate foot.

6. The structure of claim 5, wherein the gate head is substantially centered above the elongated gate foot.

7. The structure of claim 5, wherein the gate head is off-set above the elongated gate foot.

8. The structure of claim 5, wherein the elongated tapered portion is narrower than the elongated gate foot at a connection between the gate head and the top portion of the elongated gate foot.

9. The structure of claim 5, wherein the conductive first deposition gate material and the conductive second deposition gate material comprise a metal.

* * * * *